United States Patent
Jiang et al.

(10) Patent No.: US 7,633,157 B2
(45) Date of Patent: Dec. 15, 2009

(54) MICROELECTRONIC DEVICES HAVING A CURVED SURFACE AND METHODS FOR MANUFACTURING THE SAME

(75) Inventors: Tongbi Jiang, Boise, ID (US); Zhong-Yi Xia, Boise, ID (US); Sandhya Sandireddy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 79 days.

(21) Appl. No.: 11/301,619

(22) Filed: Dec. 13, 2005

(65) Prior Publication Data

US 2007/0132089 A1    Jun. 14, 2007

(51) Int. Cl.
*H01L 23/34* (2006.01)
*H01L 21/00* (2006.01)

(52) U.S. Cl. ............... 257/724; 257/782; 257/790; 257/E23.126; 257/E23.129; 257/E21.502; 438/126

(58) Field of Classification Search ............ None
See application file for complete search history.

(56) References Cited

U.S. PATENT DOCUMENTS

| | | | | |
|---|---|---|---|---|
| 5,036,024 A * | 7/1991 | Mine et al. | ............ | 29/827 |
| 5,107,328 A | 4/1992 | Kinsman | | |
| 5,138,434 A | 8/1992 | Wood et al. | | |
| 5,938,956 A | 8/1999 | Hembree et al. | | |
| 6,066,514 A | 5/2000 | King et al. | | |
| 6,089,920 A | 7/2000 | Farnworth et al. | | |
| 6,191,952 B1 * | 2/2001 | Jimarez et al. | ............ | 361/771 |
| 6,259,153 B1 | 7/2001 | Corisis | | |
| 6,271,109 B1 * | 8/2001 | Weygan et al. | ............ | 438/612 |
| 6,392,143 B1 * | 5/2002 | Koshio | ............ | 174/528 |
| 6,432,796 B1 | 8/2002 | Peterson | | |
| 6,564,979 B2 | 5/2003 | Savaria | | |
| 6,633,078 B2 * | 10/2003 | Hamaguchi et al. | ............ | 257/686 |
| 6,707,167 B2 * | 3/2004 | Huang et al. | ............ | 257/790 |
| 6,885,426 B2 * | 4/2005 | Matsui et al. | ............ | 349/187 |
| 6,936,501 B1 * | 8/2005 | Too et al. | ............ | 438/122 |
| 7,145,253 B1 * | 12/2006 | Kim et al. | ............ | 257/790 |
| 7,262,074 B2 * | 8/2007 | Hall et al. | ............ | 438/106 |

(Continued)

FOREIGN PATENT DOCUMENTS

JP        05082676 A   *   4/1993

(Continued)

OTHER PUBLICATIONS

Maikap, S. et al., "Package-strain-enhanced device and circuit performance," 50th International Electron Device Meeting, Technical Digest, pp. 233-236, IEEE Internatioal, Dec. 2004, ISBN: 0-7803-8684-1.

*Primary Examiner*—Alonzo Chambliss
(74) *Attorney, Agent, or Firm*—Perkins Coie LLP

(57) ABSTRACT

Microelectronic devices and methods for manufacturing microelectronic devices are disclosed herein. In one embodiment, a device includes a support member and a flexed microelectronic die mounted to the support member. The flexed microelectronic die has a plurality of terminals electrically coupled to the support member and an integrated circuit operably coupled to the terminals. The die can be a processor, memory, imager, or other suitable die. The support member can be a lead frame, a plurality of electrically conductive leads, and/or an interposer substrate.

32 Claims, 10 Drawing Sheets

U.S. PATENT DOCUMENTS

2003/0218263 A1 * 11/2003 Blaszczak et al. ............ 257/788
2004/0061243 A1 * 4/2004 Bai ........................... 257/787
2004/0084784 A1 * 5/2004 Mueller et al. .............. 257/788
2006/0038183 A1 * 2/2006 Oliver ........................ 257/79

FOREIGN PATENT DOCUMENTS

JP 11204566 A * 7/1999
JP 2003318218 A * 11/2003

* cited by examiner

US 7,633,157 B2

MICROELECTRONIC DEVICES HAVING A CURVED SURFACE AND METHODS FOR MANUFACTURING THE SAME

TECHNICAL FIELD

The present invention is related to microelectronic devices and methods for manufacturing microelectronic devices.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, physical vapor deposition, plasma enhanced chemical vapor deposition, plating, planarizing, etching, etc.). The dies typically include an array of very small bond-pads electrically coupled to the integrated circuitry. The bond-pads are the external electrical contacts on the die through which the supply voltage, signals, etc., are transmitted to and from the integrated circuitry. The dies are then separated from one another (i.e., singulated) by backgrinding the wafer followed by dicing. After the dies have been singulated, they are typically "packaged" to couple the bond-pads to a larger array of electrical terminals that can be more easily coupled to the various power supply lines, signal lines, and ground lines.

Conventional processes for packaging dies include electrically coupling the bond-pads on the dies to an array of pins, ball-pads, or other types of electrical terminals, and then encapsulating the dies to protect them from environmental factors (e.g., moisture, particulates, static electricity, and physical impact). In one application, the bond-pads are electrically connected to contacts on an interposer substrate that has an array of ball-pads. For example, FIG. 1 schematically illustrates a conventional packaged microelectronic device 2 including a microelectronic die 10, an interposer substrate 20 attached to the die 10, a plurality of wire-bonds 32 electrically coupling the die 10 to the substrate 20, a casing 50 protecting the die 10 from environmental factors, and a plurality of solder balls 60 attached to the substrate 20. The die 10 and interposer substrate 20 have a flat, planar configuration so that the solder balls 60 are aligned and positioned for attachment to an external device such as a printed circuit board.

Conventional memory dies 10 such as DRAM chips include an integrated circuit 12 with memory cells for retaining data. The data in each memory cell is based on a capacitor's ability to hold a charge. As a result, the die 10 must periodically refresh the data (i.e., recharge the capacitors) or the data will be lost. The refresh time of a die is related to the time that the weakest memory cell holds a charge. Refreshing the data in the memory cells requires internal resources that increase the power consumption of the die, reduce the speed at which the die operates, and/or increase the size of the die. As a result, it is desirable to increase the refresh time of memory dies.

DETAILED DESCRIPTION

A. Overview

Figure 1:
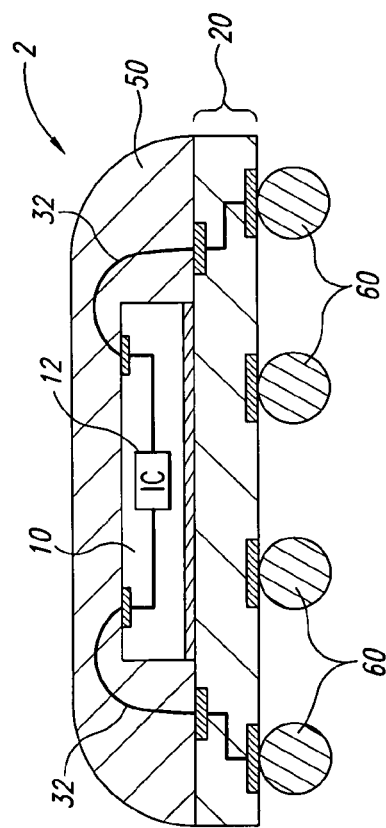
FIG. 1 schematically illustrates a conventional packaged microelectronic device in accordance with the prior art.

The following disclosure describes several embodiments of microelectronic devices and methods for manufacturing microelectronic devices. An embodiment of one such device includes a support member and a flexed microelectronic die mounted to the support member. The flexed microelectronic die has a plurality of terminals electrically coupled to the support member and an integrated circuit operably coupled to the terminals. The die can be for a processor, memory device, imager, or other suitable device. The support member can be a lead frame, a plurality of electrically conductive leads, and/or an interposer substrate.

In another embodiment, a microelectronic device includes a bent processor or memory die, a support member attached to the bent processor or memory die, and a casing covering at least a portion of the support member and the die. The processor or memory die has an integrated circuit and a plurality of terminals operably coupled to the integrated circuit. The support member is electrically coupled to the terminals of the die. The device may further include a stress material disposed on a surface of the die such that the casing also covers the stress material.

Another aspect of the invention is directed to methods for manufacturing a microelectronic device. In one embodiment, a method includes attaching a microelectronic die to a support member, bending the microelectronic die, and encapsulating at least a portion of the support member and the bent microelectronic die. The die can be bent by several different processes. For example, the die can be bent by placing a stress material on a surface of the die and at least partially curing the stress material. The die could also be bent by placing the die in a cavity of a mold and exerting a force against the die and/or the support member. Moreover, the die can be bent by placing the die in a mold and changing the pressure in a cavity of the mold. Furthermore, if the die and support member have different coefficients of thermal expansion, the die can be bent by attaching the die to the support member with at least one of the components at a temperature different than the ambient temperature.

In another embodiment, a method includes (a) mounting a processor or memory die to a support member, (b) electrically coupling the terminals of the processor or memory die to the support member, (c) flexing the processor or memory die such that the die has a curved surface, and (d) encapsulating at least a portion of the flexed processor or memory die and the support member with a casing. The processor or memory die has an integrated circuit and a plurality of terminals operably coupled to the integrated circuit.

Specific details of several embodiments of the invention are described below with reference to microelectronic devices with memory or processor dies, but in other embodiments the microelectronic devices can include other types of dies. Several details describing well-known structures or processes often associated with fabricating microelectronic dies and microelectronic devices are not set forth in the following description for purposes of brevity and clarity. Also, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 2A-10. Where the context permits, singular or plural terms may also include the plural or singular term, respectively. Moreover, unless the word "or" is expressly limited to mean only a single item exclusive from other items in reference to a list of at least two items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same features and/or types of other features and components are not precluded.

B. Embodiments of Methods for Manufacturing Microelectronic Devices

Figure 2A:
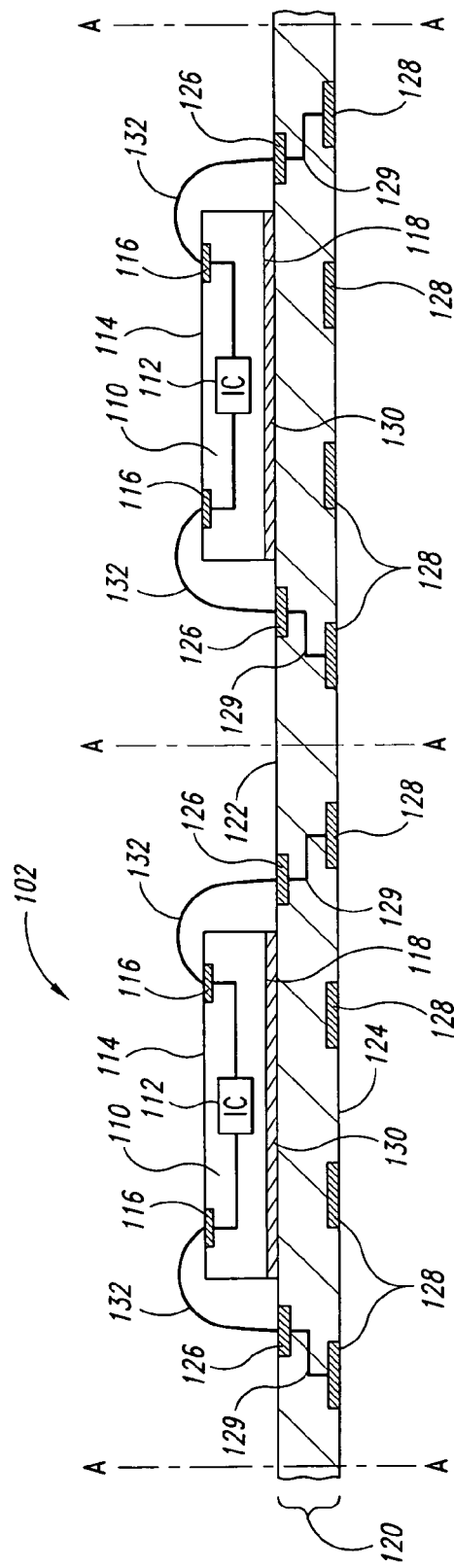
FIGS. 2A-2F illustrate stages of a method for manufacturing a plurality of microelectronic devices in accordance with one embodiment of the invention.

FIGS. 2A-2F illustrate stages in one embodiment of a method for manufacturing a plurality of microelectronic devices. For example, FIG. 2A is a schematic side cross-sectional view of a microelectronic component assembly 100 including a plurality of microelectronic dies 110 (only two are shown) arranged in an array on an interposer substrate 120. The individual dies 110 include an integrated circuit 112 (shown schematically), an active side 114, a plurality of terminals 116 (e.g., bond-pads) arranged in an array on the active side 114, and a backside 118 opposite the active side 114. The backsides 118 of the dies 110 are attached to the interposer substrate 120 with an adhesive 130, such as an adhesive film, epoxy, tape, paste, or other suitable material. The dies 110 can be processor, memory, imager, or other types of dies. Although the illustrated dies 110 have the same structure, in other embodiments, the dies 110 may have different features or otherwise perform different functions.

The interposer substrate 120 can be a printed circuit board or other support member for carrying the dies 110. In the illustrated embodiment, the interposer substrate 120 includes a first side 122 with a plurality of first contacts 126 and a second side 124 with a plurality of pads 128. The first contacts 126 can be arranged in arrays and electrically coupled to corresponding terminals 116 on the dies 110 with a plurality of wire-bonds 132. The pads 128 can be arranged in arrays to receive a plurality of electrical couplers (e.g., solder balls). The interposer substrate 120 further includes a plurality of conductive traces 129 electrically coupling the contacts 126 to corresponding pads 128. After wire-bonding, the assembly 100 can be cut along lines A-A to singulate a plurality of individual microelectronic devices 102.

Figure 2B:
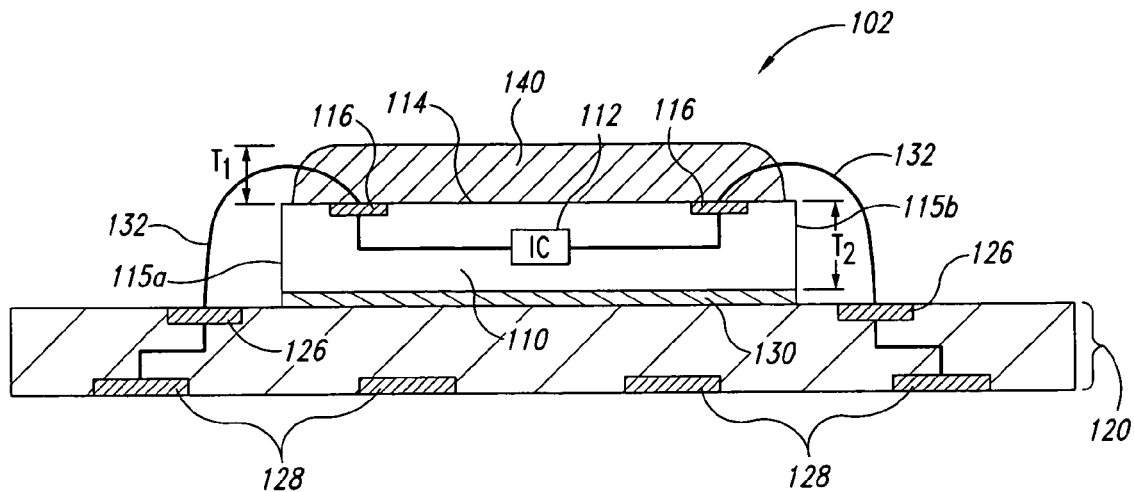

FIG. 2B is a schematic side cross-sectional view of a microelectronic device 102 after dispensing a stress material 140 onto the active side 114 of the die 110. The stress material 140 is specifically configured and arranged on the die 110 to flex the die 110. For example, the illustrated stress material 140 is placed on the die 110 in a first state and subsequently cured or otherwise changed to a second state (illustrated in FIG. 2D) in which the stress material 140 shrinks and flexes the die 110. The stress material 140 can be an underfill, epoxy, and/or other suitable material, such as product number T693/R3001EX-V3 manufactured by Nagase ChemteX Corporation of Tokyo, Japan. In the illustrated embodiment, the stress material 140 has a thickness $T_1$ between approximately 5 microns and approximately 250 microns (e.g., between 10 microns and 125 microns), and the die 110 has a thickness $T_2$ of approximately 75 microns. In other embodiments, the thickness $T_1$ of the stress material 140 can be less than 5 microns or greater than 250 microns, and the thickness $T_2$ of the die 110 can be greater than or less than 75 microns.

In additional embodiments, the stress material 140 can be deposited onto the microelectronic component assembly 100 (FIG. 2A) before singulation. For example, the stress material 140 may be dispensed onto the dies 110 before wire-bonding the terminals 116 to the contacts 126. In one such embodiment, the stress material 140 can be arranged inboard the terminals 116 or patterned to expose the terminals 116 for wire-bonding.

Figure 2C:
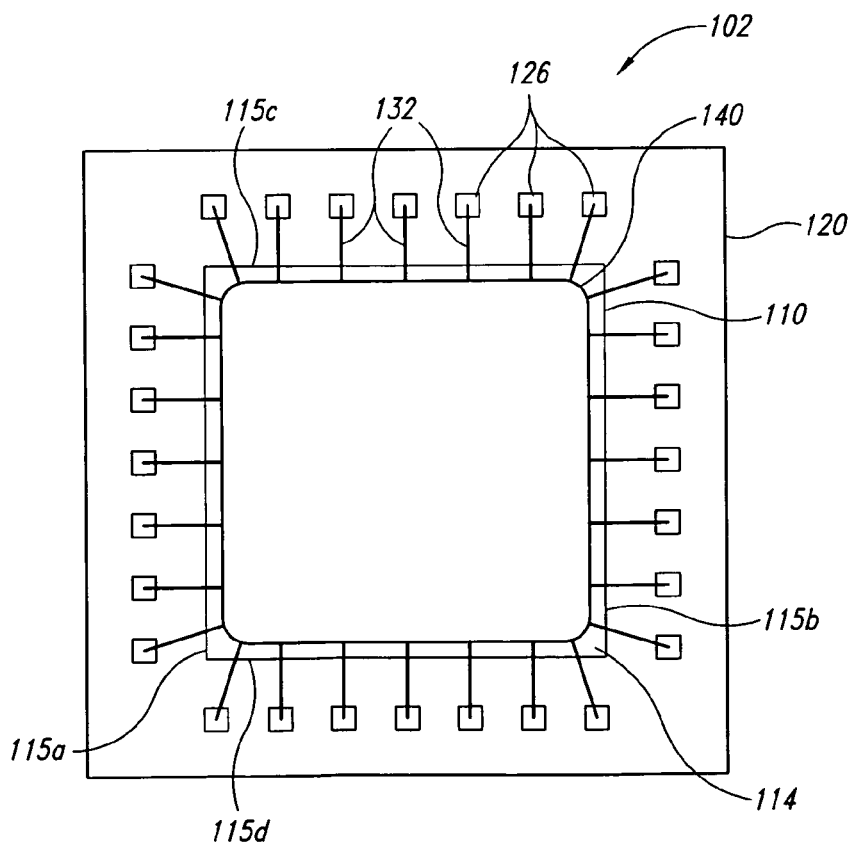

FIG. 2C is a top plan view of the microelectronic device 102 of FIG. 2B. In the example of the assembly 100 shown in FIGS. 2B and 2C, the stress material 140 is disposed across almost the entire active side 114 of the die 110 such that the material 140 covers the terminals 116 and encapsulates one end of the individual wire-bonds 132. Specifically, the stress material 140 extends from approximately a first end 115a of the die 110 to approximately a second end 115b of the die 110, and from approximately a third end 115c (FIG. 2C) of the die 110 to approximately a fourth end 115d (FIG. 2C) of the die 110. The placement of the stress material 140 across much of the active side 114 of the die 110 causes the die 110 to bend about two orthogonal axes, as described in greater detail below with reference to FIG. 2E. In other embodiments, such as the embodiment illustrated in FIG. 3A, the stress material 140 may not cover sections of the active side 114 of the die 110. In one such embodiment, the configuration of the stress material 140 may bend the die 110 about only a single axis. In either case, the stress material 140 causes the die 110 to bend about at least one axis.

Figure 2D:
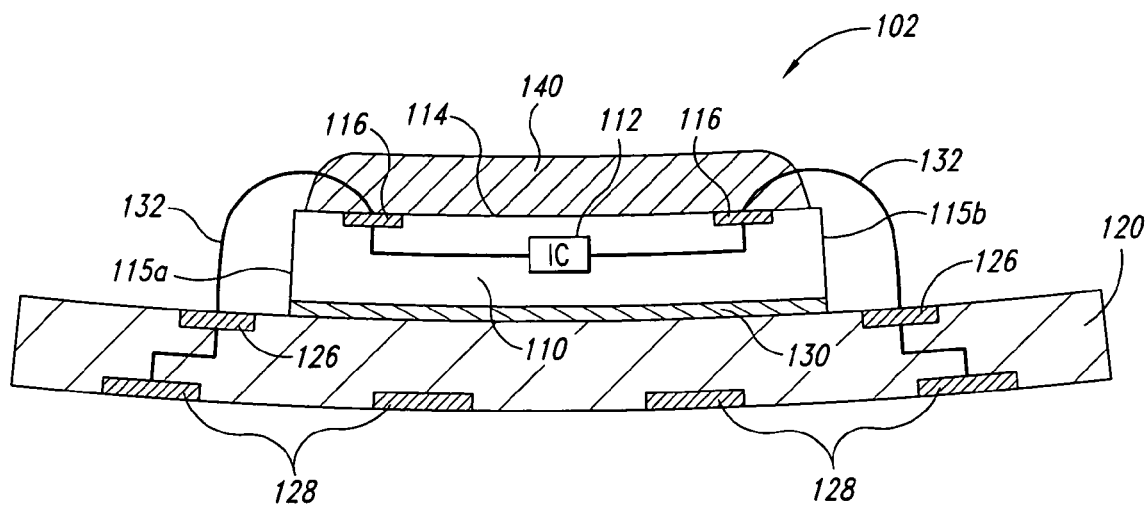

FIG. 2D is a schematic side cross-sectional view of the microelectronic device 102 after curing the stress material 140. The illustrated stress material 140 shrinks during curing, which flexes the die 110 and bends the interposer substrate 120. As a result, the die 110 has a first curvature, and the interposer substrate 120 has a second curvature corresponding to the first curvature.

Figure 2E:
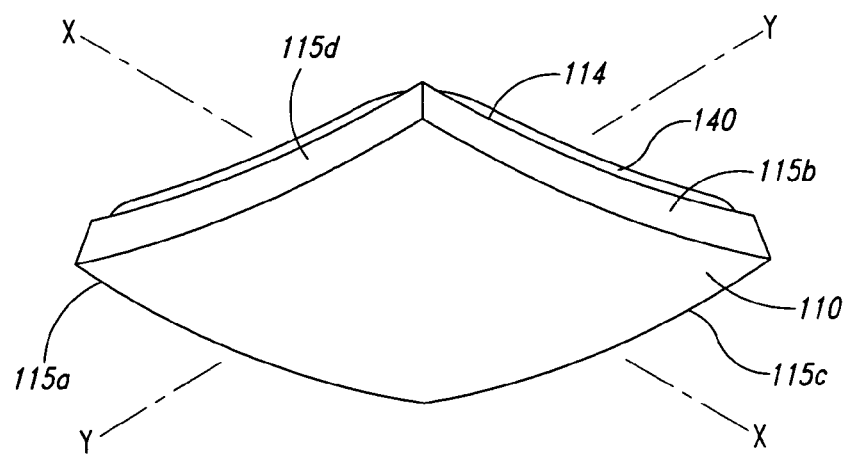

FIG. 2E is a schematic isometric view of the microelectronic die 110 and the stress material 140 with the wire-bonds 132 and the interposer substrate 120 removed to better illustrate the curvature of the die 110. The configuration of the stress material 140 in the illustrated embodiment causes the die 110 to bend about a first axis X-X and a second axis Y-Y oriented generally normal to the first axis X-X. Specifically, the portion of the die 110 extending between the first and second ends 115a-b is bent about the first axis X-X, and the portion of the die 110 extending between the third and fourth ends 115c-d is bent about the second axis Y-Y. As a result, the four edges between the active side 114 and the first, second, third, and fourth ends 115*a-d*, respectively, have an arcuate configuration. In other embodiments, however, the die 110 can have a different curvature based on the configuration of the stress material 140.

Figure 2F:
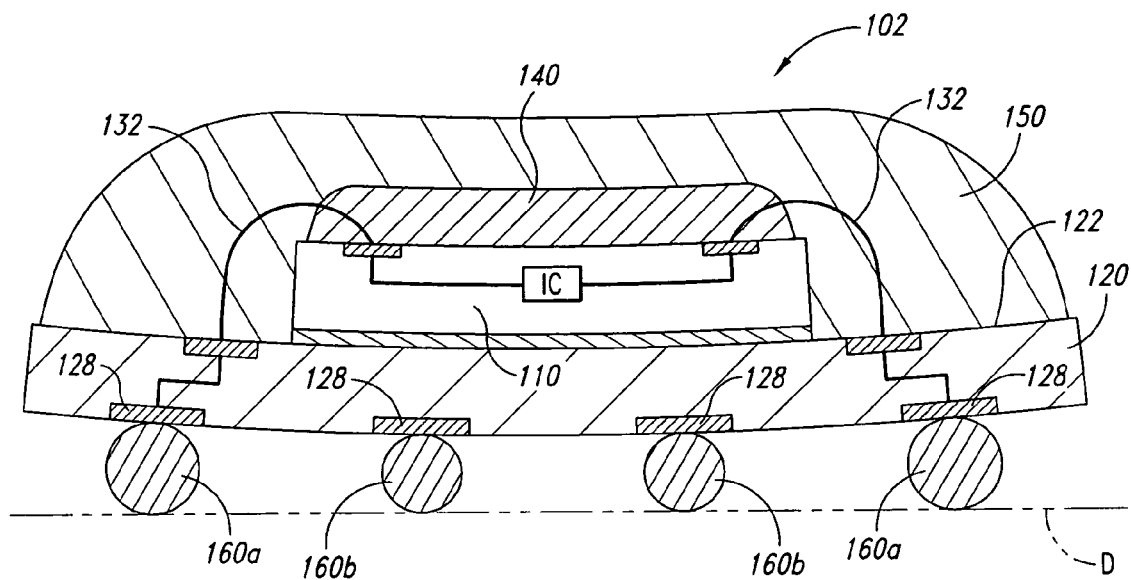

FIG. 2F is a schematic side cross-sectional view of the microelectronic device 102 after forming a casing 150 and attaching a plurality of electrical couplers 160 (identified as 160*a-b*; e.g., solder balls) to the interposer substrate 120. The casing 150 encapsulates the microelectronic die 110, the wire-bonds 132, and a portion of the interposer substrate 120. The casing 150 can be formed by conventional injection molding or other suitable processes. Suitable materials for the casing 150 include Product No. SUMIKON EME-G760S manufactured by Sumitomo Bakelite Co. of Tokyo, Japan.

After forming the casing 150, the electrical couplers 160 can be attached to corresponding pads 128 on the interposer substrate 120. In the illustrated embodiment, the electrical couplers 160 have different sizes corresponding to the curvature of the interposer substrate 120. For example, the outboard electrical couplers 160*a* have a greater diameter than the inboard electrical couplers 160*b* so that the distal end of the electrical couplers 160 defines a plane D. As a result, the electrical couplers 160 can be easily attached to a printed circuit board or other planar member. In other embodiments, however, the electrical couplers 160 can have generally the same size. For example, although in the illustrated embodiment both the die 110 and the interposer substrate 120 are flexed, in other embodiments, only the die 110 may be flexed and the interposer substrate 120 may have a generally planar configuration.

One feature of the method for manufacturing the microelectronic device 102 illustrated in FIGS. 2A-2F is that flexing the die 110 induces internal stress within the die 110. An advantage of this feature is that the stress is expected to increase the retention of the memory cells in the die 110. As a result, the refresh time of the memory cells can be increased without losing the data in the memory cells. For example, in one test, a group of unflexed dies had an average refresh time of 249.8 ms, and a group of flexed dies had an average refresh time of 276.8 ms, which represents an approximately 11% improvement. Other tests, however, have yielded different results.

C. Additional Embodiments of Microelectronic Devices

Figure 3A:
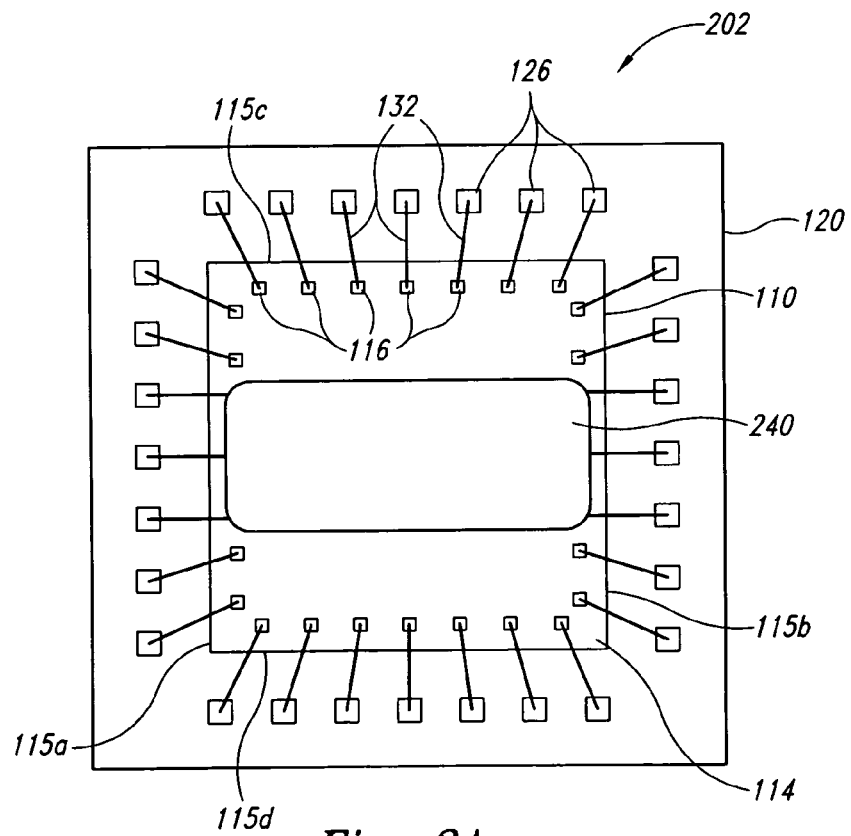
FIG. 3A is a top plan view of a microelectronic device in accordance with another embodiment of the invention.

FIG. 3A is a top plan view of a microelectronic device 202 in accordance with another embodiment of the invention. The microelectronic device 202 is generally similar to the microelectronic device 102 described above with reference to FIG. 2C. For example, the microelectronic device 202 includes a die 110, an interposer substrate 120 carrying the die 110, and a stress material 240 on the die 110. The illustrated stress material 240, however, does not cover several sections of the active side 114 of the die 110. Specifically, the stress material 240 extends from approximately the first end 115*a* of the die 110 to approximately the second end 115*b* of the die 110, and is spaced apart from the third and fourth ends 115*c-d* of the die 110. As a result, the stress material 240 covers the perimeter portion of the active side 114 adjacent to the first and second ends 115*a-b*, but does not cover the perimeter portion of the active side 114 proximate to the third and fourth ends 115*c-d*.

Figure 3B:
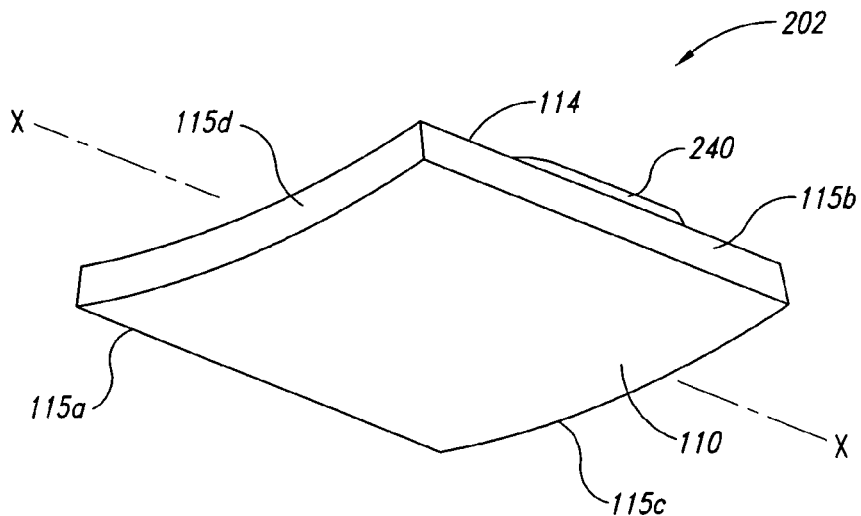
FIG. 3B is a schematic isometric view of the microelectronic die and the stress material of FIG. 3A.

FIG. 3B is a schematic isometric view of the microelectronic die 110 and the stress material 240 after curing the stress material 240. The wire-bonds 132 and the interposer substrate 120 are not shown in FIG. 3B to better illustrate the curvature of the die 310. The configuration of the stress material 240 in the illustrated embodiment causes the die 110 to bend about a single axis X-X. In other embodiments, the stress material may be configured such that the die 110 bends and has a complex curvature.

Figure 4:
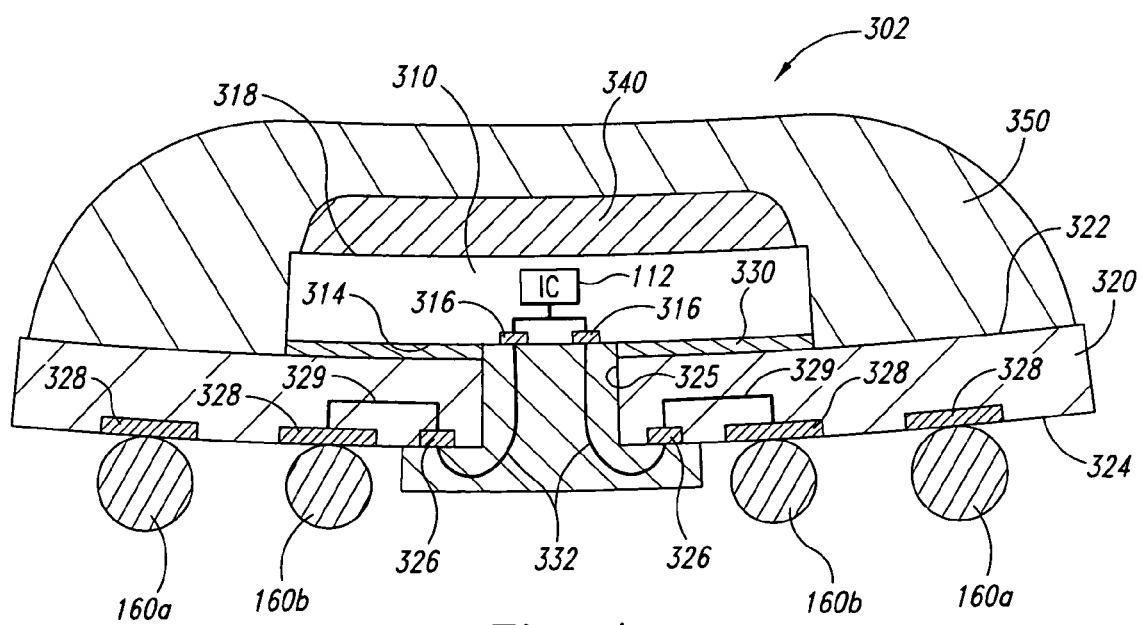
FIG. 4 is a schematic side cross-sectional view of a microelectronic device in accordance with another embodiment of the invention.

FIG. 4 is a schematic side cross-sectional view of a microelectronic device 302 in accordance with another embodiment of the invention. The microelectronic device 302 includes a microelectronic die 310 and an interposer substrate 320 carrying the die 310. The illustrated microelectronic die 310 includes an integrated circuit 112 (shown schematically), an active side 314, a plurality of terminals 316 (e.g., bondpads) arranged in an array on the active side 314, and a backside 318 opposite the active side 314. The illustrated interposer substrate 320 includes a first side 322 attached to the active side 314 of the die 310 with an adhesive 330, a second side 324 opposite the first side 322, a plurality of contacts 326 on the second side 324, a plurality of pads 328 on the second side 324, a plurality of conductive traces 329 electrically coupling the contacts 326 to corresponding pads 328, and a slot 325 extending between the first and second sides 322 and 324.

The microelectronic device 302 further includes (a) a plurality of wire-bonds 332 extending through the slot 325 and electrically coupling the terminals 316 on the die 310 to corresponding contacts 326 on the interposer substrate 320, and (b) a stress material 340 on the backside 318 of the die 310. The stress material 340 may be disposed on the backside 318 in an arrangement similar to one of the configurations of stress material described above with reference to FIGS. 2C and 3A. Alternatively, the stress material 340 may be dispensed in a different pattern on the die 310. In either case, the stress material 340 is configured to bend the die 310 in a desired direction. After depositing the stress material 340, the material 340 is cured to flex the die 310. The illustrated microelectronic device 302 further includes a plurality of electrical couplers 160 attached to corresponding pads 328, and a casing 350 encapsulating the stress material 340, the microelectronic die 310, and the wire-bonds 332.

Figure 5:
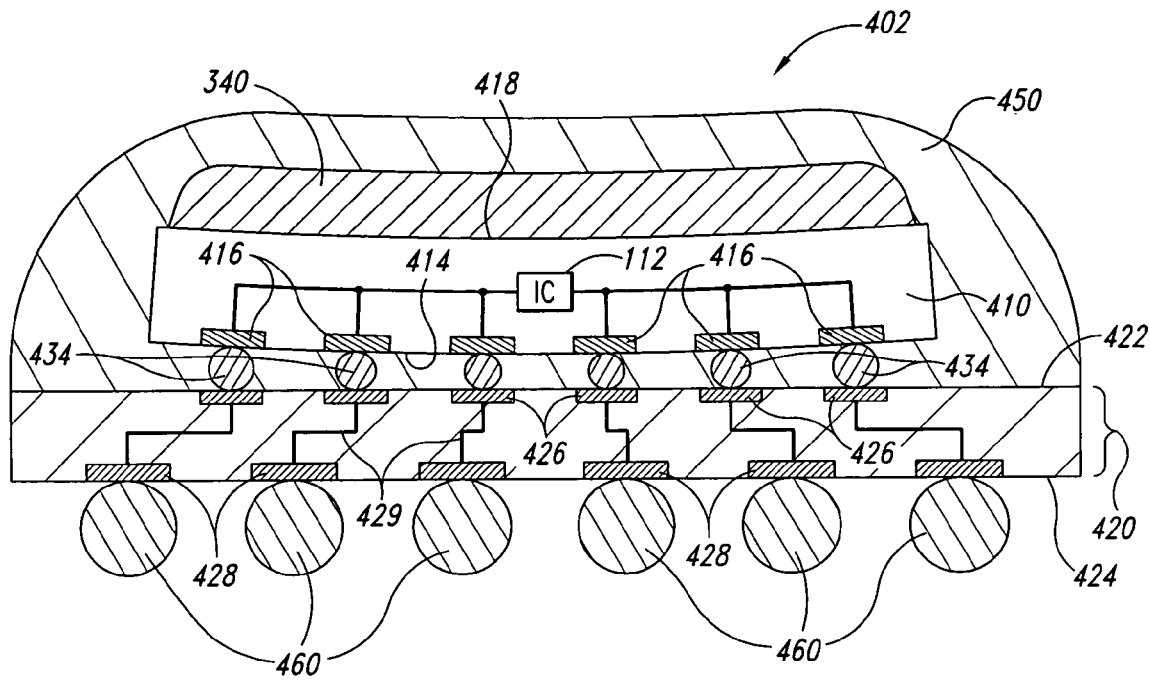
FIG. 5 is a schematic side cross-sectional view of a microelectronic device in accordance with another embodiment of the invention.

FIG. 5 is a schematic side cross-sectional view of a microelectronic device 402 in accordance with another embodiment of the invention. The microelectronic device 402 includes a microelectronic die 410 and an interposer substrate 420 carrying the die 410. The microelectronic die 410 includes an integrated circuit 112 (shown schematically), an active side 414, a plurality of terminals 416 (e.g., bond-pads) arranged in an array on the active side 414, and a backside 418 opposite the active side 414. The interposer substrate 420 includes a first side 422 facing the active side 414 of the die 410, a second side 424 opposite the first side 422, a plurality of contacts 426 arranged in an array on the first side 422, a plurality of pads 428 arranged in an array on the second side 424, and a plurality of traces 429 electrically coupling the contacts 426 to corresponding pads 428. The array of contacts 426 is generally aligned with the array of terminals 416 on the die 410.

The microelectronic device 402 further includes (a) a stress material 340 disposed on the backside 418 of the microelectronic die 410, and (b) a plurality of interconnect elements 434 electrically connecting the terminals 416 of the die 410 to corresponding contacts 426 on the interposer substrate 420. The stress material 340 can be generally similar to the stress material 340 described above with reference to FIG. 4. In the illustrated embodiment, however, the cured stress material 340 flexes the die 410 but not the interposer substrate 420. As a result, the interconnect elements 434 have a different size corresponding to the curvature of the die 410. Specifically, the outboard interconnect elements 434 are larger than the inboard elements 434. The microelectronic device 402 further includes (a) a casing 450 encapsulating the die 410 and the stress material 340, and (b) a plurality of electrical couplers 460 attached to corresponding pads 428 of the interposer substrate 420. In additional embodiments, the interposer substrate 420 may also be flexed and have a curvature corresponding to the curvature of the die 410.

Figure 6:
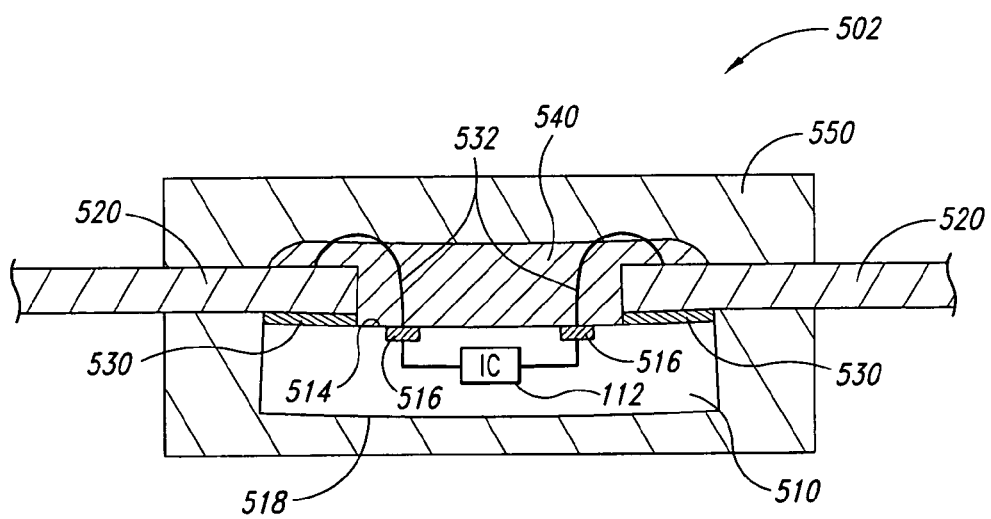
FIG. 6 is a schematic side cross-sectional view of a microelectronic device in accordance with another embodiment of the invention.

FIG. 6 is a schematic side cross-sectional view of a microelectronic device 502 in accordance with another embodiment of the invention. The illustrated microelectronic device 502 includes a microelectronic die 510 and a plurality of leads 520 attached to the die 510. The microelectronic die 510 includes an integrated circuit 112 (shown schematically), an active side 514, a plurality of terminals 516 (e.g., bond-pads) arranged in an array on the active side 514, and a backside 518 opposite the active side 514. The leads 520 are attached to the active side 514 of the die 510 with an adhesive 530 and electrically connected to corresponding terminals 516 with a plurality of wire-bonds 532. The illustrated microelectronic device 502 further includes (a) a stress material 540 disposed on the active side 514 of the die 510, and (b) a casing 550 encapsulating the microelectronic die 510 and the wire-bonds 532. Although the illustrated stress material 540 is disposed on the active side 514 of the die 510 and covers an inner portion of the leads 520, in other embodiments, the stress material 540 may not cover a portion of the leads 520 and/or may be deposited on the backside 518 of the die 510. In either case, the cured stress material 540 bends the die 510.

Figure 7:
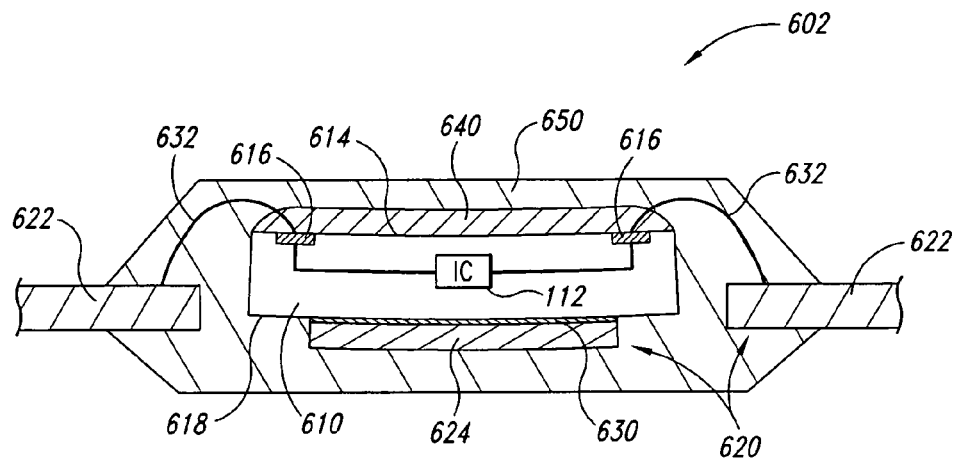
FIG. 7 is a schematic side cross-sectional view of a microelectronic device in accordance with another embodiment of the invention.

FIG. 7 is a schematic side cross-sectional view of a microelectronic device 602 in accordance with another embodiment of the invention. The microelectronic device 602 includes a microelectronic die 610 and a lead frame 620 attached to the die 610. The microelectronic die 610 includes an integrated circuit 112 (shown schematically), an active side 614, a plurality of terminals 616 (e.g., bond-pads) arranged in an array on the active side 614, and a backside 618 opposite the active side 614. The lead frame 620 includes a plurality of leads 622 and a die paddle 624 attached to the backside 618 of the die 610 with an adhesive 630. The microelectronic device 602 further includes (a) a plurality of wire-bonds 632 electrically coupling the terminals 616 to corresponding leads 622, (b) a casing 650 encapsulating the microelectronic die 610 and the wire-bonds 632, and (c) a stress material 640 disposed on the active side 614 of the die 610. The stress material 640 can be generally similar to any one of the materials described above. In other embodiments, the stress material 640 can be deposited onto the surface of the die paddle 624 opposite the die 610. In either case, the cured stress material 640 bends the die 610 about at least one axis.

D. Additional Embodiments of Methods for Manufacturing Microelectronic Devices

Figure 8A:
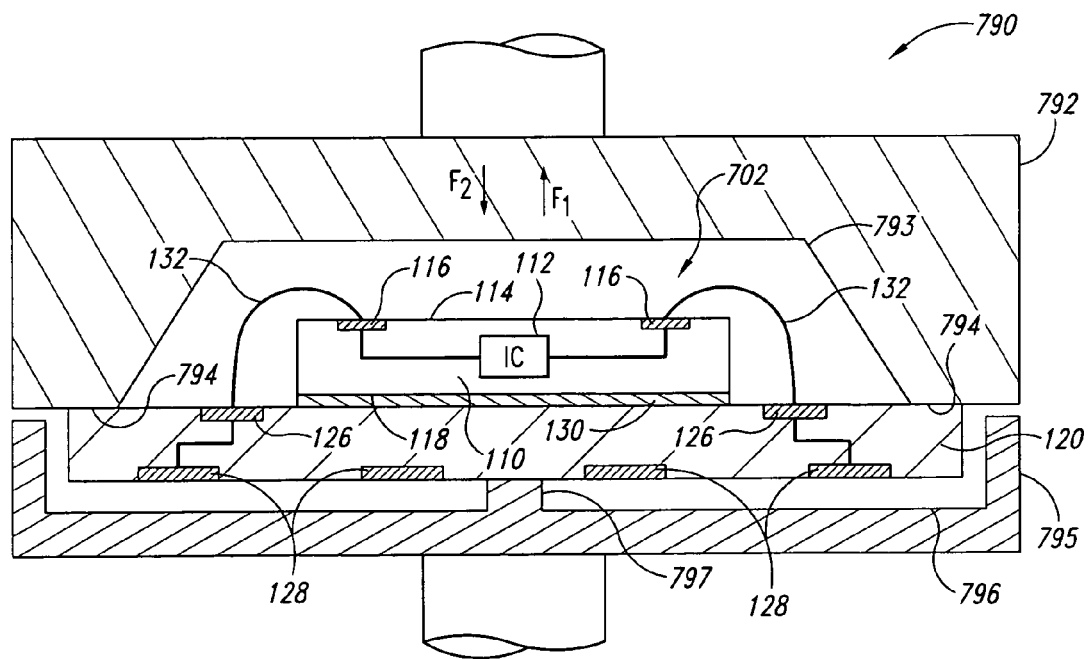
FIGS. 8A-8C illustrate stages of a method for manufacturing a microelectronic device in accordance with one embodiment of the invention.
Figure 8B:
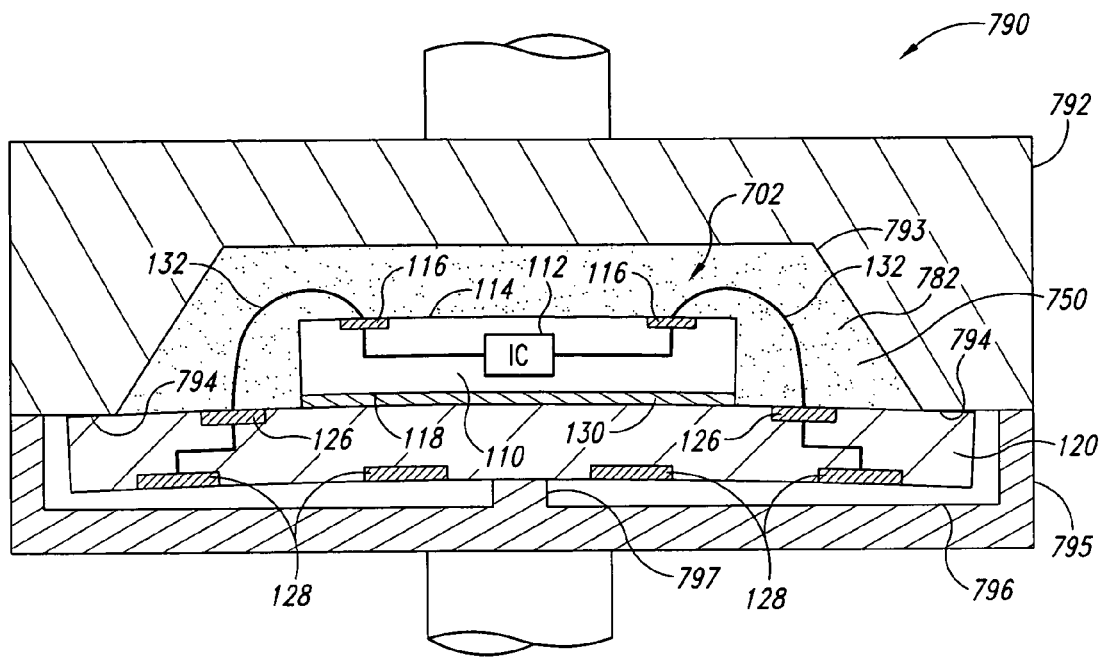
Figure 8C:
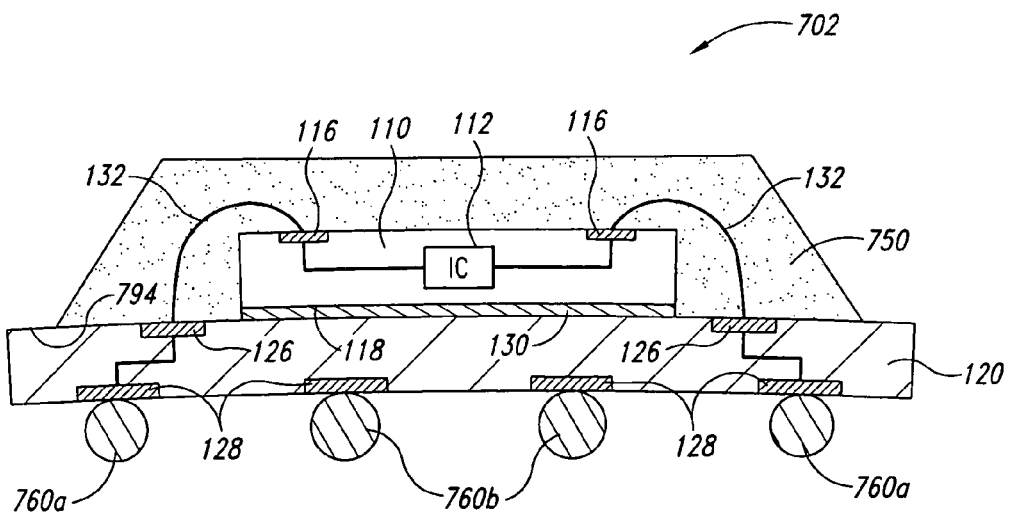

FIGS. 8A-8C illustrate stages of a method for manufacturing a microelectronic device in accordance with another embodiment of the invention. For example, FIG. 8A is a schematic side cross-sectional view of a mold apparatus 790 for encapsulating a microelectronic device 702. The microelectronic device 702 is generally similar to the microelectronic device 102 described above with reference to FIG. 2B. For example, the microelectronic device 702 includes a microelectronic die 110 and an interposer substrate 120 carrying the die 110. The illustrated microelectronic device 702, however, does not include a stress material. The illustrated mold apparatus 790 includes (a) an upper mold portion 792 with an upper mold cavity 793, and (b) a lower mold portion 795 with a lower mold cavity 796 and a projection 797 at a central portion of the cavity 796. After loading the microelectronic device 702 into the mold apparatus 790, the upper and lower mold portions 792 and 795 move toward each other to flex the die 110 and the interposer substrate 120. Specifically, the projection 797 exerts a force in a direction $F_1$ against a central portion of the interposer substrate 120, and a surface 794 of the upper mold portion 792 exerts a force in a direction $F_2$ against a perimeter portion of the interposer substrate 120. The forces exerted by the projection 797 and the surface 794 flex the microelectronic die 110 and the interposer substrate 120.

FIG. 8B is a schematic side cross-sectional view of the flexed microelectronic device 702 in the mold apparatus 790. After bending the device 702, a mold compound 782 is introduced into the upper mold cavity 793 and flows around the flexed microelectronic die 110 to form a casing 750. The casing 750 encapsulates the die 110, the wire-bonds 132, and a portion of the interposer substrate 120.

FIG. 8C is a schematic side cross-sectional view of the microelectronic device 702 removed from the mold apparatus 790. After forming the casing 750, a plurality of electrical couplers 760 (identified individually as 760a-b) can be attached to corresponding pads 128 on the interposer substrate 120. Although in the illustrated embodiment, the microelectronic die 110 and the interposer substrate 120 have a curvature extending inwardly upwardly, in other embodiments, the die 110 and the interposer substrate 120 can have a curvature extending inwardly downwardly. For example, the lower mold portion 795 may not include the projection 797, but rather the upper mold portion 792 can include a projection positioned to exert a force against a central portion of the active side 114 of the die 110.

Figure 9A:
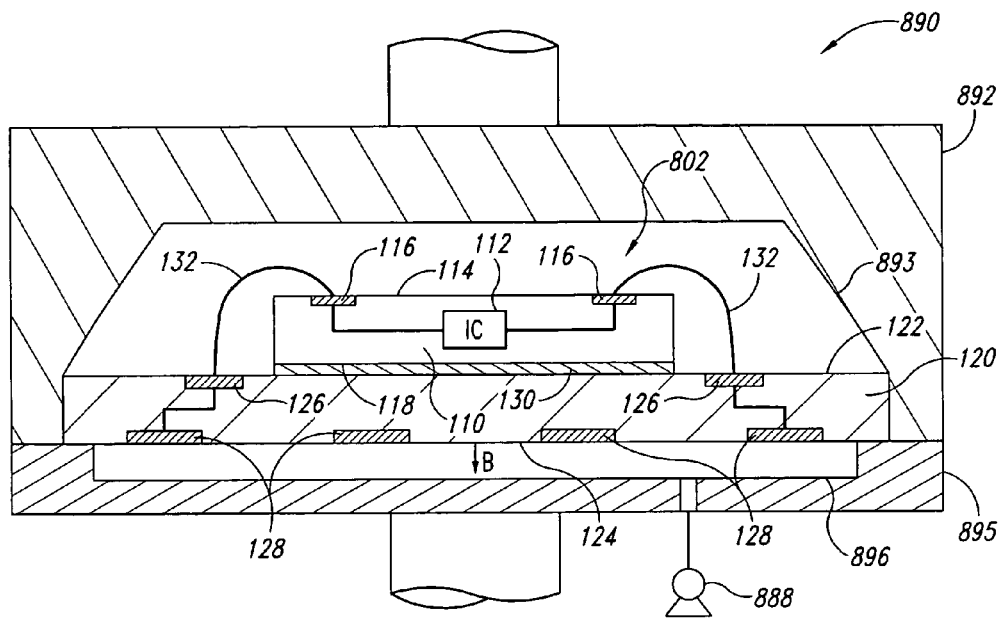
FIGS. 9A-9C illustrate stages of a method for manufacturing a microelectronic device in accordance with another embodiment of the invention.
Figure 9B:
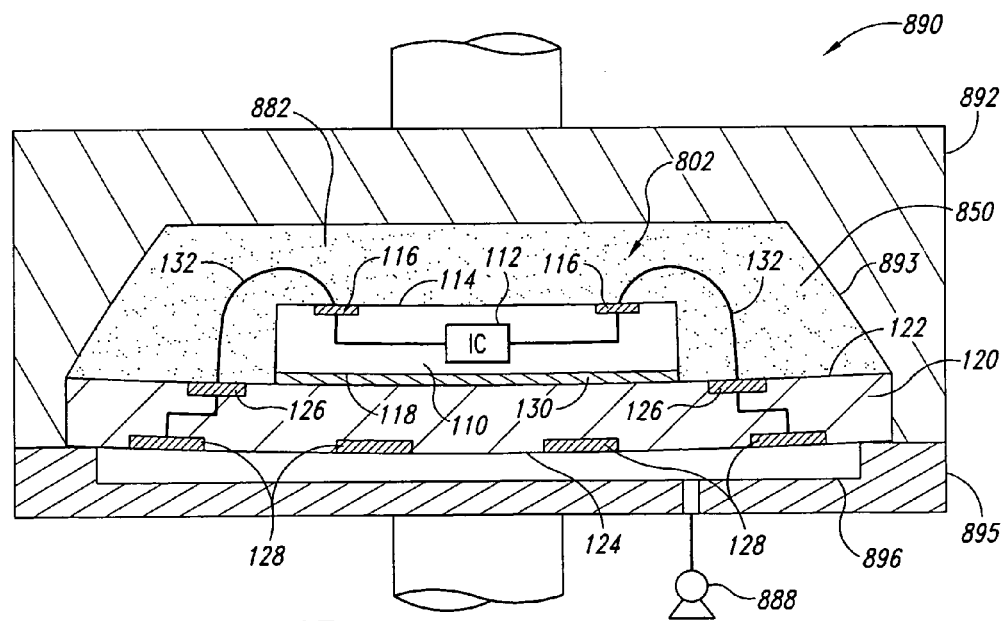
Figure 9C:
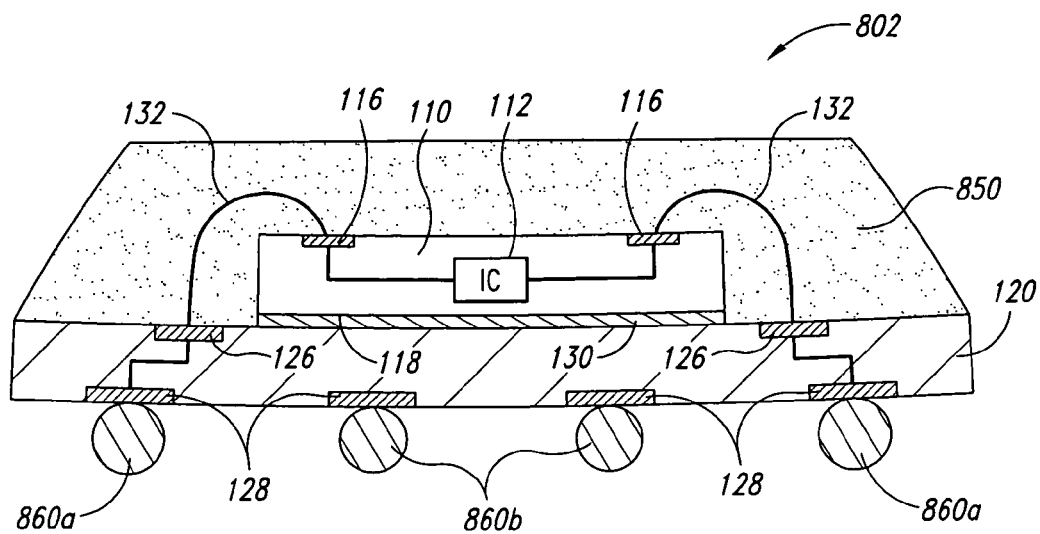

FIGS. 9A-9C illustrate stages of a method for manufacturing a microelectronic device in accordance with another embodiment of the invention. For example, FIG. 9A is a schematic side cross-sectional view of a mold apparatus 890 for encapsulating a microelectronic device 802. The microelectronic device 802 is generally similar to the microelectronic device 702 described above with reference to FIGS. 8A-8C. For example, the microelectronic device 802 includes a microelectronic die 110 and an interposer substrate 120 carrying the die 110. The illustrated mold apparatus 890 includes (a) an upper mold portion 892 with an upper mold cavity 893, (b) a lower mold portion 895 with a lower mold cavity 896, and (c) a vacuum pump 888 operably coupled to the lower mold cavity 896 to remove gas from the cavity 896. After loading the microelectronic device 802 into the mold apparatus 890, the vacuum pump 888 removes gas from the lower mold cavity 896 and creates a pressure differential between the upper and lower mold cavities 893 and 896. Because the upper mold cavity 893 has a greater pressure than the lower mold cavity 896, the microelectronic die 110 and the interposer substrate 120 flex downward in a direction B.

FIG. 9B is a schematic side cross-sectional view of the flexed microelectronic device 802 in the mold apparatus 890. After bending the device 802, a mold compound 882 is introduced into the upper mold cavity 893 and flows around the flexed microelectronic die 110 to form a casing 850. The casing 850 encapsulates the die 110, the wire-bonds 132, and a portion of the interposer substrate 120.

FIG. 9C is a schematic side cross-sectional view of the microelectronic device 802 removed from the mold apparatus 890. After forming the casing 850, a plurality of electrical couplers 860 (identified individually as 860a-b) can be attached to corresponding pads 128 on the interposer substrate 120. Although in the illustrated embodiment, the microelectronic die 110 and the interposer substrate 120 have a curvature extending inwardly downwardly, in other embodiments, the die 110 and the interposer substrate 120 can have a curvature extending inwardly upwardly. For example, the vacuum pump 888 can flow gas into the lower mold cavity 896 so that the lower mold cavity 896 has a greater pressure than the upper mold cavity 893, which urges the die 110 and the interposer substrate 120 to flex upward toward the upper mold cavity 893.

Figure 10:
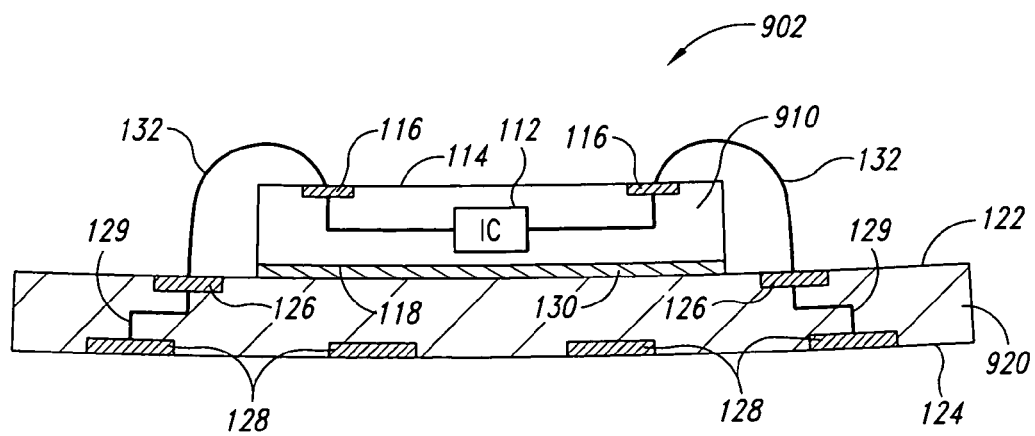
FIG. 10 is a schematic side cross-sectional view of a microelectronic device in accordance with another embodiment of the invention.

FIG. 10 is a schematic side cross-sectional view of a microelectronic device 902 in accordance with another embodiment of the invention. The illustrated microelectronic device 902 is generally similar to the microelectronic device 702 described above with reference to FIGS. 8A-8C. For example, the microelectronic device 902 includes a microelectronic die 910 and an interposer substrate 920 carrying the die 910. In the illustrated embodiment, however, the microelectronic die 910 has a first coefficient of thermal expansion, and the interposer substrate 920 has a second coefficient of thermal expansion different than the first coefficient of thermal expansion. Before attaching the microelectronic die 910 to the interposer substrate 920, the die 910 and/or the substrate 920 is heated or cooled so that the temperature of the component(s) is different than the ambient temperature of the device 902. As a result, when the microelectronic die 910 and/or the interposer substrate 920 warms or cools to the ambient temperature, the difference in the coefficients of thermal expansion causes the die 910 and the interposer substrate 920 to flex either inwardly downwardly or inwardly upwardly. The flexed microelectronic device 902 can be subsequently encapsulated, and a plurality of electrical couplers can be attached to corresponding pads on the interposer substrate 920.

From the foregoing, it will be appreciated that specific embodiments of the invention have been described herein for purposes of illustration, but that various modifications may be made without deviating from the spirit and scope of the invention. For example, many of the elements of one embodiment can be combined with other embodiments in addition to or in lieu of the elements of the other embodiments. Accordingly, the invention is not limited except as by the appended claims.

We claim:

1. A microelectronic device, comprising:
a support member having a plurality of contacts;
a microelectronic die mounted to the support member, the microelectronic die having a plurality of terminals electrically coupled to the contacts of the support member and an integrated circuit including a plurality of memory cells operably coupled to the terminals;
a stress material on the microelectronic die and having an induced strain that flexes the microelectronic die, the stress material and the support member being separate components, wherein the microelectronic die has a curved surface and an internal stress from the induced strain of the stress material, and wherein the internal stress of the microelectronic die increases retention of the memory cells from a value when the microelectronic die is unflexed; and
a molding compound encapsulating the support member, the microelectronic die, and the stress material.

2. The microelectronic device of claim 1 wherein the die further comprises a curved surface having a central portion, a perimeter portion, and an intermediate portion between the central and perimeter portions, and wherein the device further comprises:
a plurality of wire-bonds electrically connecting the contacts of the support member to corresponding terminals on the die.

3. The microelectronic device of claim 1 wherein the support member comprises a lead frame.

4. The microelectronic device of claim 1 wherein the support member comprises a plurality of electrically conductive leads.

5. The microelectronic device of claim 1 wherein the support member comprises an interposer substrate.

6. The microelectronic device of claim 1 wherein:
the support member comprises a substrate having a first side, a second side opposite the first side, an opening extending between the first and second sides, and the plurality of contacts on the second side;
the microelectronic die further comprises an active side with the terminals;
the active side of the die is attached to the first side of the support member; and
the device further comprises a plurality of wire-bonds extending through the opening and electrically connecting the contacts to corresponding terminals on the die.

7. The microelectronic device of claim 1 wherein:
the support member comprises a substrate having a first side and the plurality of contacts on the first side;
the microelectronic die further comprises an active side with the terminals;
the active side of the die faces the first side of the support member; and
the device further comprises a plurality of interconnect elements attaching the contacts to corresponding terminals.

8. The microelectronic device of claim 1 wherein:
the support member comprises a substrate having a first side and the plurality of contacts on the first side;
the microelectronic die further comprises an active side with the terminals and a backside opposite the active side;
the backside of the die is attached to the first side of the support member; and
the device further comprises a plurality of wire-bonds electrically connecting the contacts to corresponding terminals.

9. The microelectronic device of claim 1 wherein the microelectronic die comprises a processor or memory die.

10. The microelectronic device of claim 1 wherein the support member has a first coefficient of thermal expansion and the microelectronic die has a second coefficient of thermal expansion different than the first coefficient of thermal expansion.

11. The microelectronic device of claim 1 wherein the die has a first curvature and the support member has a second curvature corresponding to the first curvature.

12. The microelectronic device of claim 1 wherein the microelectronic die comprises a surface having at least three edges, and wherein the at least three edges each include an arcuate portion.

13. A microelectronic device, comprising:
a processor or memory die having an integrated circuit including a plurality of memory cells and a plurality of terminals operably coupled to the memory cells of the integrated circuit;
a support member attached to the processor or memory die, the support member having a plurality of contacts electrically coupled to the terminals;
a stress material on the processor or memory die and having an induced strain that bends the processor or memory die, the stress material and the support member being separate components, wherein the processor or memory die has a curved surface and an internal stress from the induced strain of the stress material, and wherein the internal stress of the processor or memory die increases retention of the memory cells from a value when the memory die is unflexed; and a casing covering at least a portion of the stress material, the support member and the die.

14. The microelectronic device of claim 13, further comprising a plurality of wire-bonds electrically connecting the contacts to corresponding terminals.

15. The microelectronic device of claim 13 wherein:
the processor or memory die further comprises a surface having a central portion, a perimeter portion, and an intermediate portion between the central and perimeter portions; and
wherein the stress material is disposed across at least a section of the intermediate and central portions of the surface of the die.

16. The microelectronic device of claim 13 wherein the support member has a first coefficient of thermal expansion and the processor or memory die has a second coefficient of thermal expansion different than the first coefficient of thermal expansion.

17. The microelectronic device of claim 13 wherein the processor or memory die has a first curvature and the support member has a second curvature corresponding to the first curvature.

18. The microelectronic device of claim 13 wherein the processor or memory die comprises a surface having at least three edges, and wherein the at least three edges each include an arcuate portion.

19. A microelectronic device, comprising:
a microelectronic die having a plurality of terminals and an integrated circuit including a plurality of memory cells operably coupled to the terminals;
a substrate carrying the microelectronic die, the substrate including a plurality of contacts electrically coupled to corresponding terminals of the microelectronic die; and
a stress material on the microelectronic die and having an induced strain that flexes the microelectronic die but not the substrate carrying the microelectronic die, the stress material and the support member being separate components, wherein the microelectronic die has a curved surface and an internal stress from the induced strain of the stress material, and wherein the internal stress of the microelectronic die increases retention of the memory cells from a value when the microelectronic die is unflexed.

20. The microelectronic device of claim 19 wherein the microelectronic die includes an active side on which the terminals are arranged in an array and a backside opposite the active side, and wherein the substrate includes a first side facing the active side of the microelectronic die and a second side opposite the first side, and wherein the contacts are arranged in an array on the first side, and wherein the device further includes a plurality of interconnect elements electrically connecting the terminal of the microelectronic die to corresponding contacts on the substrate.

21. The microelectronic device of claim 20 wherein the interconnect elements have different sizes corresponding to a curvature of the die.

22. The microelectronic device of claim 20 wherein the interconnect elements include a first interconnect element positioned outwardly from a central region of the substrate and a second interconnect element positioned proximate to the central region of the substrate, and wherein the first interconnect element is larger than the second interconnect element.

23. The microelectronic device of claim 20 wherein the stress material is disposed on substantially the entire active side of the microelectronic die.

24. The microelectronic device of claim 20 wherein the microelectronic die includes a first end opposite a second end and a third end opposite a fourth end, and wherein the stress material extends from approximately the first end to the second end and is spaced apart from the third and fourth ends.

25. The microelectronic device of claim 23 wherein the stress material is under an internal strain that causes the microelectronic die to bend about two orthogonal axes.

26. The microelectronic device of claim 24 wherein the stress material is under an internal strain that causes the microelectronic die to bend about one orthogonal axis.

27. A microelectronic device, comprising:
a support member having a plurality of contacts on a first side and a plurality of electrical couplers on a second side opposite the first side, the individual contacts being coupled to corresponding electrical couplers;
a memory die mounted to the support member, the memory die having a plurality of memory cells operably coupled to a plurality of terminals, the terminals being electrically coupled to the contacts on the first side of the support member;
a stress material on the memory die, the stress material flexing the memory die away from the support member to induce an internal stress in the memory die, the stress material and the support member being separate components, wherein the internal stress of the memory die increases retention of the memory cells from a value when the memory die is unflexed; and
a molding compound encapsulating the support member, the memory die, and the stress material.

28. The microelectronic device of claim 27 wherein:
the memory die further comprises a surface having a central portion, a perimeter portion, and an intermediate portion between the central and perimeter portions; and
wherein the stress material is disposed across at least a section of the intermediate and central portions of the surface of the memory die.

29. The microelectronic device of claim 27 wherein the support member has a first coefficient of thermal expansion and the memory die has a second coefficient of thermal expansion different than the first coefficient of thermal expansion.

30. The microelectronic device of claim 27 wherein the memory die has a first curvature and the support member has a second curvature corresponding to the first curvature.

31. The microelectronic device of claim 27 wherein the stress material does not flex the support member.

32. The microelectronic device of claim 27 wherein the memory die comprises a surface having at least three edges, and wherein the at least three edges each include an arcuate portion.

* * * * *